(12) United States Patent
Avramescu et al.

(10) Patent No.: US 8,994,000 B2
(45) Date of Patent: Mar. 31, 2015

(54) OPTOELECTRONIC SEMICONDUCTOR CHIP

(75) Inventors: Adrian Avramescu, Regensburg (DE); Volker Härle, Laaber (DE); Lutz Höppel, Alteglofsheim (DE); Matthias Peter, Alteglofsheim (DE); Matthias Sabathil, Regensburg (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 136 days.

(21) Appl. No.: 13/546,857

(22) Filed: Jul. 11, 2012

(65) Prior Publication Data

US 2012/0280207 A1    Nov. 8, 2012

Related U.S. Application Data

(63) Continuation of application No. 11/989,512, filed on Dec. 12, 2008, now abandoned.

(30) Foreign Application Priority Data

Jul. 29, 2005 (DE) .......................... 10 2005 035 722
Jul. 28, 2006 (DE) .................. PCT/DE2006/001323

(51) Int. Cl.
*H01L 29/06* (2006.01)
*H01S 5/343* (2006.01)
(Continued)

(52) U.S. Cl.
CPC ............. *H01S 5/34333* (2013.01); *B82Y 20/00* (2013.01); *H01L 33/04* (2013.01); *H01S 5/0421* (2013.01); *H01L 33/06* (2013.01); *H01L 33/32* (2013.01); *H01S 5/2009* (2013.01); *H01S 5/3072* (2013.01);
(Continued)

(58) Field of Classification Search
USPC ............... 257/13, 14, 15, 22, 79, 94, 99, 103, 257/E33.008, E33.029, E33.034, E33.031, 257/E33.033, E33.023; 438/22, 46
See application file for complete search history.

(56) References Cited

U.S. PATENT DOCUMENTS 4,989,935 A    2/1991   Stein
5,684,737 A    11/1997  Wang et al.
(Continued)

FOREIGN PATENT DOCUMENTS

CN    1292934    4/2001
CN    1484880    3/2004
(Continued)

OTHER PUBLICATIONS

"Indium Gallium Arsenide", Wikipedia, Jun. 25, 2013, (8 pages).
(Continued)

*Primary Examiner* — Cuong Q Nguyen
(74) *Attorney, Agent, or Firm* — Cozen O'Connor (57) ABSTRACT

An optoelectronic semiconductor chip comprises the following sequence of regions in a growth direction (c) of the semiconductor chip (20): a p doped barrier layer (1) for an active region (2), the active region (2), which is suitable for generating electromagnetic radiation, the active region being based on a hexagonal compound semiconductor, and an n doped barrier layer (3) for the active region (2). Also disclosed are a component comprising such a semiconductor chip, and to a method for producing such a semiconductor chip.

20 Claims, 5 Drawing Sheets

(51) Int. Cl.
*B82Y 20/00* (2011.01)
*H01L 33/04* (2010.01)
*H01S 5/042* (2006.01)
*H01L 33/06* (2010.01)
*H01L 33/32* (2010.01)
*H01S 5/20* (2006.01)
*H01S 5/30* (2006.01)
*H01S 5/32* (2006.01)
*H01S 5/34* (2006.01)

(52) U.S. Cl.
CPC .............. *H01S 5/3095* (2013.01); *H01S 5/3202* (2013.01); *H01S 5/3407* (2013.01); *H01L 2924/0002* (2013.01)
USPC ............................................ 257/14; 257/99

(56) References Cited

U.S. PATENT DOCUMENTS

| | | | |
|---|---|---|---|
| 5,965,908 A * | 10/1999 | Shibata et al. | 257/94 |
| 5,985,696 A | 11/1999 | Brunner et al. | |
| 6,057,564 A | 5/2000 | Rennie | |
| 6,066,861 A | 5/2000 | Höhn et al. | |
| 6,340,788 B1 | 1/2002 | King et al. | |
| 6,515,313 B1 | 2/2003 | Ibbetson et al. | |
| 6,821,806 B1 | 11/2004 | Takahashi et al. | |
| 6,849,881 B1 | 2/2005 | Harle et al. | |
| 6,995,030 B2 | 2/2006 | Illek et al. | |
| 7,145,181 B2 | 12/2006 | Wirth | |
| 2002/0081055 A1 | 6/2002 | Painter et al. | |
| 2002/0121646 A1 | 9/2002 | Khare et al. | |
| 2002/0171092 A1 | 11/2002 | Goetz et al. | |
| 2003/0003613 A1 | 1/2003 | Hsieh | |
| 2003/0085409 A1 | 5/2003 | Shen et al. | |
| 2003/0151042 A1 | 8/2003 | Hueschen | |
| 2004/0021142 A1 | 2/2004 | Kuo | |
| 2004/0159843 A1 | 8/2004 | Edmond | |
| 2004/0222431 A1 | 11/2004 | Flynn et al. | |
| 2005/0067627 A1 | 3/2005 | Shen et al. | |
| 2005/0127391 A1 | 6/2005 | Yanamoto | |
| 2007/0012927 A1 | 1/2007 | Linder | |
| 2008/0001165 A1 | 1/2008 | Hashimoto et al. | |

FOREIGN PATENT DOCUMENTS

| | | |
|---|---|---|
| DE | 102 13 358 | 10/2002 |
| DE | 10208021 | 10/2002 |
| EP | 1 394 865 | 3/2004 |
| EP | 1403935 | 3/2004 |
| JP | 62-128586 | 6/1987 |
| JP | 63-232368 | 9/1988 |
| JP | 02-150089 | 6/1990 |
| JP | 09-260692 | 10/1997 |
| JP | 09-260962 | 10/1997 |
| JP | 09-321389 | 12/1997 |
| JP | 10-135570 | 5/1998 |
| JP | 10-242512 | 9/1998 |
| JP | 2002-231997 | 8/2002 |
| JP | 2002-314129 | 10/2002 |
| JP | 2003-515936 | 5/2003 |
| JP | 2003-527745 | 9/2003 |
| JP | 2004-006718 | 1/2004 |
| JP | 2004-071657 | 3/2004 |
| JP | 2004-128502 | 4/2004 |
| JP | 2004-200362 | 7/2004 |
| JP | 2004-247682 | 9/2004 |
| JP | 2005-094031 | 4/2005 |
| JP | 2005-123657 | 5/2005 |
| JP | 2005-142543 | 6/2005 |
| JP | 2005-159047 | 6/2005 |
| JP | 2007-013164 | 1/2007 |
| TW | 398085 | 7/2000 |
| TW | 516246 | 1/2003 |
| TW | 541725 | 7/2003 |
| WO | WO 01/39282 | 5/2001 |
| WO | WO 02/23640 | 3/2002 |
| WO | WO 02/093658 | 11/2002 |
| WO | WO 2004/102153 | 11/2004 |
| WO | WO 2005/036658 | 4/2005 |
| WO | WO 2007/012327 | 2/2007 |

OTHER PUBLICATIONS

"Basic Parameters of Silicon Carbide(SiC)", Jul. 23, 2013, (4 pages).

* cited by examiner

OPTOELECTRONIC SEMICONDUCTOR CHIP

CROSS REFERENCE TO RELATED APPLICATIONS

This application is a Continuation of U.S. patent application Ser. No. 11/989,512, filed Dec. 12, 2008, which claims priority from German Application No. 10 2005 035 722.9 filed on Jul. 29, 2005. The disclosure of U.S. patent application Ser. No. 11/989,512 is incorporated herein by reference.

BACKGROUND OF THE INVENTION

1. Field of the Invention

The present invention is related to an optoelectronic semiconductor chip.

2. Description of the Related Art

The document US 2003/0085409A1 describes an optoelectronic semiconductor chip.

SUMMARY OF THE INVENTION

It is an object of the invention to provide an optoelectronic semiconductor chip having improved efficiency.

This and other objects are attained in accordance with one aspect of the present invention directed to an optoelectronic semiconductor chip comprising the following sequence of regions in a growth direction of the semiconductor chip: a p doped barrier layer for an active region; the active region, which is suitable for generating electromagnetic radiation, the active region being based on a hexagonal compound semiconductor; and an n doped barrier layer for the active region.

In accordance with at least one embodiment of the optoelectronic semiconductor chip, the optoelectronic semiconductor chip has a p-doped barrier layer for an active region of the semiconductor chip, which layer is disposed upstream of the active region as seen in a growth direction. That is to say that, as seen from a growth substrate of the semiconductor chip, there follows firstly the p-doped barrier layer for the active region and then the active region. The p-doped barrier layer (confinement layer) is therefore arranged spatially nearer to the growth substrate than the active region. The p-doped barrier layer is preferably a p-type barrier layer for the active region. The p-doped barrier layer can comprise a plurality of monolayers of a p-doped material.

In accordance with at least one embodiment of the optoelectronic semiconductor chip, an active region of the semiconductor chip is disposed downstream of the p-doped barrier layer in the growth direction. The active region is preferably suitable for generating radiation. That is to say that if an electric current is impressed into the semiconductor chip, then electromagnetic radiation is generated in the active region by recombination of charge carriers and at least partly leaves the semiconductor chip. In this case, the active region is preferably given by a sequence of layers.

In accordance with at least one embodiment of the optoelectronic semiconductor chip, the active region is based on a hexagonal compound semiconductor.

This means in the present context that the active region or at least one layer of the active region comprises a hexagonal compound semiconductor. That is to say that at least the active region then has a hexagonal lattice structure. By way of example, the entire optoelectronic semiconductor chip is then based on a hexagonal compound semiconductor. That is to say that the semiconductor material of the semiconductor chip has a hexagonal lattice structure.

The hexagonal compound semiconductor is for example semiconductor structures composed of binary, ternary and/or quaternary compounds of elements of main groups II and VI of the periodic system of chemical elements. By way of example, one of the following compounds can be involved: ZnO, ZnMgO, CdS, ZnCdS, MgBeO. Furthermore, the hexagonal compound semiconductor can be a semiconductor structure composed of a binary, ternary and/or quaternary compound of elements of main group III with a nitride. By way of example, one of the following semiconductor structures can be involved: BN, AlGaN, GaN, AlGaInN or further III-V compounds.

In this case, the compound semiconductor in the active region need not necessarily have a mathematically exact composition according to one of the above formulae. Rather, it can have one or more dopants and also additional constituents which essentially do not change the characteristic physical properties of the material. For the sake of simplicity, however, the above formulae only comprise the essential constituents of the crystal lattice, even if these can be replaced in part by smaller quantities of further substances.

In accordance with at least one embodiment of the optoelectronic semiconductor chip, an n-doped barrier layer of the active region is disposed downstream of the active region in the growth direction. That is to say that the n-doped barrier layer succeeds the active region in the growth direction. The n-doped barrier layer is therefore spatially further away from the growth substrate than the active region. The n-doped barrier layer preferably comprises a plurality of monolayers of an n-doped material. The n-doped barrier layer represents a barrier layer for the active region.

In accordance with at least one embodiment of the optoelectronic semiconductor chip, the semiconductor chip has the following sequence of regions in a growth direction: a p-doped barrier layer for the active region, the active region, which is suitable for generating electromagnetic radiation, and is based on a hexagonal compound semiconductor, and an n-doped barrier layer for the active region. That is to say that, as seen in the growth direction, a p-type barrier layer for the active region is succeeded by the active region, which is in turn succeeded by an n-type barrier layer for the active region. In this case, the p-type and n-type barrier layers limit the charge carriers in the active region. Preferably, the growth direction is parallel to the crystallographic c axis of the semiconductor chip.

In accordance with at least one embodiment of the optoelectronic semiconductor chip, the active region is based on the III-V semiconductor material system $In_yGa_{1-x-y}Al_xN$ where $0 \leq x \leq 1$, $0 \leq y \leq 1$ and $x+y \leq 1$.

This means in the present context that the active region or at least one layer of the active region comprises a nitride-III/V compound semiconductor material, preferably system $In_yGa_{1-x-y}Al_xN$ where $0 \leq x \leq 1$, $0 \leq y \leq 1$ and $x+y \leq 1$ hold true. In this case, this material need not necessarily have a mathematically exact composition according to the above formula. Rather, it can have one or more dopants and also additional constituents which essentially do not change the characteristic physical properties of the system $In_yGa_{1-x-y}Al_xN$ material. For the sake of simplicity, however, the above formula only comprises the essential constituents of the crystal lattice such as Al, Ga, In, N, even if these can be replaced in part by small quantities of further substances.

Preferably, the active region is suitable, during operation of the semiconductor chip, for generating electromagnetic radiation in at least one of the following spectral ranges: ultraviolet, blue, blue-green, yellow, red. By way of example, the emission wavelength can be set by means of the indium concentration. For this purpose, the active region is preferably based on the III-V semiconductor material system $In_yGa_{1-y}N$ where $0<y\leq1$.

In accordance with at least one embodiment of the optoelectronic semiconductor chip, the semiconductor chip has the following sequence of regions in a growth direction: a p-doped barrier layer for the active region, the active region, which is suitable for generating electromagnetic radiation, and is based on the III-V semiconductor material system $In_yGa_{1-x-y}Al_xN$ where $0\leq x\leq1$, $0\leq y\leq1$ and $x+y\leq1$, and an n-doped barrier layer for the active region. That is to say that, as seen in the growth direction, a p-type barrier layer for the active region is succeeded by the active region, which is in turn succeeded by an n-type barrier layer for the active region. In this case, the p-type and n-type barrier layers limit the charge carriers in the active region. In this case, the semiconductor chip is preferably grown in the Ga-face growth mode. The growth direction is parallel to the crystallographic c axis.

In this case, the optoelectronic semiconductor chip makes use of the following insight, inter alia. In the case of a hexagonal compound semiconductor—for example in the case of a semiconductor chip based on the III-V semiconductor material system $In_yGa_{1-x-y}Al_xN$ where $0\leq x\leq1$, $0\leq y\leq1$ and $x+y\leq1$—piezoelectric fields occur in the active region, which can comprise InGaN quantum wells, for example, on account of the polar wurtzite crystal structure and the strain in the active region. Said piezoelectric fields are oriented along the growth direction. The polarity of said fields is dependent on the growth mode in which the semiconductor chip is grown. When using metal organic vapor phase epitaxy (MOVPE), for example, growth preferably takes place in the Ga-face growth mode. For a GaN crystal, for example, this means that in the case of the Ga—N double layers from which the crystal is formed, the gallium atoms lie in the direction of that surface of the crystal which is remote from the growth substrate. In the case of crystals which are grown in the Ga-face growth mode and in which the growth direction runs parallel to the crystallographic c axis, the crystallographic c axis and the electric field point away from the substrate to the crystal surface. The polarization of the piezoelectric fields on account of the strains in the active region has the opposite direction. The lattice charges induced by the polarization are negative at that side of the active region which faces the crystal surface, and positive at that side of the active region which faces the interface between substrate and grown crystal. The polarity of the piezoelectric fields in the direction of the c axis can be influenced only with difficulty in the Ga-face growth mode.

In the case of a sequence of layers around the active region in which n-type barrier layer, active region, p-type barrier layer succeed one another in the growth direction, that is to say parallel to the crystallographic c axis, the piezoelectric fields in this case lead to an unfavorable barrier structure which makes it more difficult for charge carriers to be injected into the active region. Owing to this, such optoelectronic semiconductor chips have an internal quantum efficiency which falls greatly with the density of the current impressed into the semiconductor chip. The proposed sequence in the growth direction of p-doped barrier layer, active region, n-doped barrier layer utilizes said polarity of the piezoelectric fields to support the trapping of charge carriers in the active region. Given this order of the layer construction, therefore, the piezoelectric fields contribute to an improved trapping of charge carriers in the active region. As a result, the internal quantum efficiency becomes virtually independent of the current density.

In accordance with at least one embodiment of the optoelectronic semiconductor chip, a diffusion barrier is arranged between p-doped barrier layer and the active region. The diffusion barrier is suitable for impeding a penetration of the p-type dopant from the barrier layer into the active region. That is to say that only a very small proportion of the p-type dopant can pass through the diffusion barrier from the p-doped barrier layer into the active region. In this case, as seen in the growth direction, the diffusion barrier is disposed downstream of the p-doped barrier layer and disposed upstream of the active region. The diffusion barrier can be arranged directly between p-doped barrier layer and active region. That is to say that the diffusion barrier then has a respective interface with both regions of the optoelectronic semiconductor chip. The diffusion barrier preferably comprises a plurality of layers that can differ in terms of their composition—for example in terms of their doping or the degree of their doping. The barrier layer is preferably suitable for impeding the diffusion of a p-type dopant such as, for example, the diffusion of magnesium.

In accordance with at least one embodiment of the optoelectronic semiconductor chip, a tunnel contact is disposed upstream of the p-type barrier layer as seen in the growth direction. Said tunnel contact is therefore arranged nearer to a growth substrate of the optoelectronic semiconductor chip than the p-doped barrier layer. Preferably, the tunnel contact directly adjoins the p-doped barrier layer, that is to say that the tunnel contact has an interface with said barrier layer.

In accordance with at least one embodiment of the optoelectronic semiconductor chip, the tunnel contact has a highly n-doped region remote from the p-doped barrier layer. Furthermore, the tunnel contact has a highly p-doped region facing the p-doped barrier layer. Furthermore, the tunnel contact preferably has a diffusion barrier between the two regions of the tunnel contact. The diffusion barrier is preferably suitable for inhibiting or preventing a diffusion of at least the p-type dopant into the n-doped region of the tunnel contact.

In accordance with at least one embodiment of the optoelectronic semiconductor chip, an n-conducting region of the semiconductor chip is disposed upstream of the tunnel contact as seen in the growth direction. That is to say that the n-conducting region is situated spatially nearer to the growth substrate than the tunnel contact. Preferably, the n-conducting region directly adjoins the tunnel contact. Particularly preferably, the n-conducting region has an interface with the tunnel contact. The tunnel contact then connects the n-conducting region to the p-doped barrier layer. The tunnel contact serves for impressing charge carriers into the p-doped barrier layer.

In this case, the optoelectronic semiconductor chip makes use of the idea, inter alia, that it is possible with the aid of the tunnel contact, between n-conducting region and p-doped barrier layer, to utilize an n-conducting growth substrate for the growth of the optoelectronic semiconductor chip. This has the advantage that the current transport can take place to the greatest possible extent in the n-conducting region having good electrical conductivity. The current is then impressed through the tunnel contact into the p-type barrier layer, which is relatively thin in comparison with the n-conducting region.

In accordance with at least one embodiment of the optoelectronic semiconductor chip, the optoelectronic semiconductor chip is grown onto a p-conducting substrate. In this case, the semiconductor layers of the chip are preferably grown onto the substrate in the Ga-face growth mode. The n-conducting region and also the tunnel contact can be dispensed with in this embodiment. By way of example, one of the following substrates can be used as p-conducting substrate: p-doped gallium nitride, p-type silicon carbide, p-Si (111).

In this case, it is also possible for the p-conducting substrate to be thinned after the growth of the layer sequence. That is to say that after the growth of the semiconductor structure which comprises the active region, inter alia, the thickness of the p-conducting substrate can be reduced or the p-conducting substrate is completely removed. Therefore, the optoelectronic semiconductor chip then has a thinned substrate or is free of a substrate.

In accordance with at least one embodiment of the optoelectronic semiconductor chip, the active region comprises at least one quantum well structure. The quantum well structure can be a multiple quantum well structure or particularly preferably a single quantum well structure. In this case, the charge carriers can be quantized in the quantum well structure, but this is not absolutely necessary.

In accordance with at least one embodiment of the optoelectronic semiconductor chip, the active region comprises precisely one single quantum well structure provided for generating radiation. That is to say that the active region has precisely one single quantum well structure in which electromagnetic radiation is generated during operation of the semiconductor chip.

In accordance with at least one embodiment, at least one quantum well structure which is not provided for generating radiation is disposed upstream of the single quantum well structure provided for generating radiation. That is to say that this optically inactive quantum well structure (pre-well) is arranged spatially nearer to the growth substrate than the optically active quantum well structure.

Preferably, a plurality of optically inactive quantum well structures are disposed upstream of the optically active quantum well structure as seen in the growth direction. By way of example, three to five optically inactive quantum well structures are disposed upstream of the optically active quantum well structure as seen in the growth direction. The optically inactive quantum well structures are preferably quantum well structures which have a smaller indium content than the optically active quantum well structure. The optically inactive quantum well structures generate no or hardly any electromagnetic radiation during operation of the semiconductor chip. They can form a superlattice for the optically active quantum well structure.

In this case, the optoelectronic semiconductor chip described makes use of the insight, inter alia, that the optically inactive pre-wells described improve the quality of the optically active quantum well structure since they can grow for example in a manner freer of stress. It has furthermore been shown that the pre-well structures described serve as diffusion barriers for a p-dopant from the p-doped barrier layer. Therefore, the pre-wells are preferably arranged between the p-doped barrier layer and the optically active quantum well.

In accordance with at least one embodiment, a diffusion barrier containing for example a material from the III-V semiconductor material system $Al_xGa_{1-x}N$ is arranged between p-doped barrier layer and the active region. In this case, the aluminum concentration is preferably at least twenty percent. Such a diffusion barrier can also be provided as an alternative to the above-described pre-wells as barrier for the p-type dopant from the p-doped barrier layer. The p-type dopant can be magnesium, for example.

In accordance with at least one embodiment of the optoelectronic semiconductor chip, the semiconductor chip is grown onto a growth substrate having a misorientation.

In this case, the optoelectronic semiconductor chip described is based on the insight, inter alia, that significantly smoother layers grow on a misoriented growth substrate than on an exactly oriented substrate. Preferably, the growth substrate has a misorientation (miscut-angle) of between 0.1 degree and 1.0 degree. Particularly preferably, the misorientation is between 0.2 degree and 0.5 degree. The growth substrate can be for example one of the following growth substrates: GaN, n-GaN, p-GaN, n-SiC, p-SiC, sapphire, n-Si (111), p-Si(111).

In accordance with at least one embodiment of the optoelectronic semiconductor chip, the growth substrate on which the semiconductor chip is grown is thinned. In the extreme case, the growth substrate is completely removed from the layer sequence grown onto the substrate. The layer sequence is then free of a substrate. In this case, the substrate can be thinned or removed from the growth substrate for example by means of grinding, etching, laser ablation or a combination of these methods.

Furthermore, an optoelectronic component is specified. In accordance with at least one embodiment, the optoelectronic component has at least one optoelectronic semiconductor chip according to at least one of the embodiments described above. The optoelectronic component is preferably a luminescence diode, that is to say a light emitting diode or a laser diode.

In accordance with at least one embodiment of the optoelectronic component, the optoelectronic component contains, alongside the at least one optoelectronic semiconductor chip, connections via which electrical contact can be made with the optoelectronic semiconductor component. That is to say that when a voltage is applied to the connections of the component, a current is impressed into the optoelectronic semiconductor chip. The optoelectronic semiconductor chip then generates electromagnetic radiation.

Furthermore, a method for producing an optoelectronic semiconductor chip according to at least one of the embodiments described above is specified. The method involves depositing the following regions onto a wafer in chronological order: a p-doped barrier layer for an active region of the optoelectronic semiconductor chip, an active region, which is suitable for generating electromagnetic radiation during operation of the semiconductor chip, the active region being based on a hexagonal compound semiconductor, and an n-doped barrier layer for the active region. The wafer can be a growth substrate on which further regions of the semiconductor chip, such as a p-conducting region or an n-conducting region, for example, may have already been deposited.

In accordance with at least one embodiment of the method for producing an optoelectronic semiconductor chip, the following regions are deposited onto a wafer in chronological order: a p-doped barrier layer for an active region of the optoelectronic semiconductor chip, an active region, which is suitable for generating electromagnetic radiation during operation of the semiconductor chip, the active region being based on the III-V semiconductor material system $In_yGa_{1-x-y}Al_xN$ where $0 \leq x \leq 1$, $0 \leq y \leq 1$ and $x+y \leq 1$, and an n-doped barrier layer for the active region. The wafer can be a growth substrate on which further regions of the semiconductor chip, such as a p-conducting region or an n-conducting region, for example, may already have been deposited.

Moreover, it is possible for further regions of the optoelectronic semiconductor chip to be deposited onto the wafer before, between or after the regions mentioned. The regions of the optoelectronic semiconductor chip are preferably deposited on the wafer by means of one of the following epitaxy methods: metal organic vapor phase epitaxy (MOVPE), molecular beam epitaxy (MBE), hybrid vapor phase epitaxy (HVPE). In this case, the regions are preferably deposited in a Ga-face growth mode.

The growth substrate on which the regions of the optoelectronic semiconductor chip are deposited can be both an n-conducting substrate or a p-conducting substrate. Furthermore, the growth substrate can have a misorientation as described further above.

In accordance with at least one embodiment of the method for producing an optoelectronic semiconductor chip, firstly the p-doped barrier layer is deposited. Afterward, that is to say before the deposition of the active region, the growth process is interrupted and the semiconductor wafer with the grown p-doped barrier layer is removed from the growth reactor. Afterward, by way of example, the coating of the reactor walls of the growth reactor is neutralized. That is to say that p-type dopant that possibly remains in the growth reactor is removed. Subsequently, the wafer with the grown p-doped barrier layer can be introduced into the reactor again and the growth can be continued as described above. A contamination of the active region with the p-type dopant can be reduced particularly efficiently in this way.

In this case, however, it is also possible for the further growth to be effected in a different growth reactor than the growth reactor in which the p-doped barrier layer is deposited.

A further possibility for producing an optoelectronic semiconductor chip in which piezoelectric fields in the active region do not represent a barrier for the injection of charge carriers consists in realizing the structure in the molecular beam epitaxy or in the metal organic vapor phase epitaxy with N excess. As a result, an N surface termination can be established during the epitaxy, that is to say that the structure is grown in the N-face growth mode. As a result, the polarization of the piezoelectric fields is reversed and the structure can be grown in the order of n-type barrier layer, active region, p-type barrier layer without the occurrence of the unfavorable barriers described.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Further advantages, preferred embodiments and developments of the semiconductor chip described here and of its constituents will become apparent from the exemplary embodiments explained below in conjunction with the figures.

DETAILED DESCRIPTION OF THE PRESENTLY PREFERRED EMBODIMENTS

In the exemplary embodiments and figures, identical or identically acting constituent parts are in each case provided with the same reference symbols. The elements illustrated in the figures should not necessarily be regarded as true to scale; rather, individual constituent parts may be illustrated in part with an exaggerated size in order to afford a better understanding.

Figure 1A:
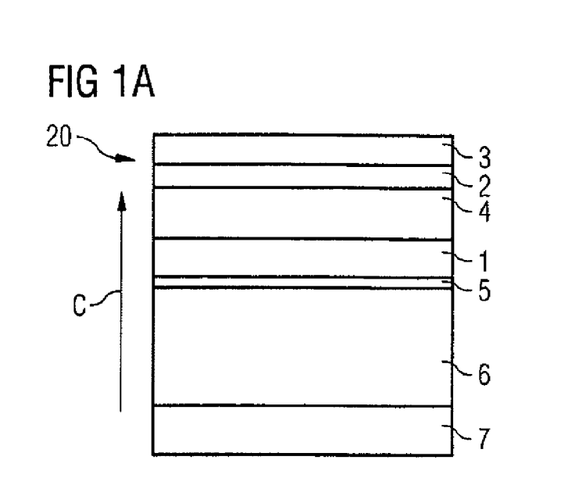
FIG. 1A shows a schematic sectional illustration of a first exemplary embodiment of the semiconductor chip described here.

FIG. 1A shows a schematic sectional illustration of a first exemplary embodiment of the optoelectronic semiconductor chip 20 described here.

In this exemplary embodiment, an n-conducting substrate preferably serves as growth substrate 7. In this case, possible n-conducting substrates are: n-GaN, n-SiC, n-Si(111). However, it is also possible for an electrically non-conductive substrate such as sapphire, for example, to be used.

In this case, the substrate 7 can have a slight misorientation that can prove to be advantageous with regard to the crystal quality of the growing layers. The misorientation of the substrate 7 is preferably between 0.2 degree and 0.5 degree, for example 0.3°. Such a misorientation leads to significantly smoother layers with reduced island growth and reduced roughness. The roughness of the growing layers can therefore be reduced as a result.

An n-conducting region 6 succeeds the substrate 7 as seen in the growth direction c. In this case, the growth direction is chosen to be parallel to the crystallographic c axis. The semiconductor chip 20 is grown in the Ga-face growth mode. The n-conducting region 6 is preferably n-doped gallium nitride. The layer thickness for the n-conducting region is approximately 1 to 5 µm, preferably between 3 and 4 µm. The n-conducting region is preferably doped with a silicon.

A tunnel contact 5 succeeds the n-conducting region 6 as seen in the growth direction c. The tunnel contact 5 is preferably a highly doped n-p tunnel junction. In this case, the n-doped side faces the n-conducting region 6. The p-doped side is remote from the n-conducting region 6. On its side facing the n-conducting region 6, the tunnel contact 5 comprises a highly n-doped $In_yGa_{1-x-y}Al_xN$ layer where $0 \leq x \leq 1$, $0 \leq y \leq 1$ and $x+y \leq 1$, or a highly n-doped $In_yGa_{1-x-y}Al_xN$ superlattice where $0 \leq x \leq 1$, $0 \leq y \leq 1$ and $x+y \leq 1$. Silicon, for example, is suitable as n-type dopant. The doping concentration is preferably at least $10^{19}$, particularly preferably at least $10^{20}$. The highly n-doped layer is preferably at most 20 nm thick.

On the side remote from the n-conducting region 6, the tunnel contact 5 comprises for example a highly p-doped $In_yGa_{1-x-y}Al_xN$ layer where $0 \le x \le 1$, $0 \le y \le 1$ and $x+y \le 1$, or a highly p-doped $In_yGa_{1-x-y}A_xN$ superlattice where $0 \le x \le 1$, $0 \le y \le 1$ and $x+y \le 1$. In this case, one possible p-type dopant is given by magnesium. The doping concentration is preferably at least $10^{19}$, particularly preferably at least $10^{20}$. The highly p-doped layer is preferably at most 20 nm thick.

The p-type barrier layer 1 succeeds the tunnel contact 5 in the growth direction c. The p-type barrier layer 1 is for example a p-doped $Al_xGa_{1-x}N$ layer where $0<x \le 0.1$. The layer thickness of the p-type barrier layer is preferably between 50 and 500 nanometers. A preferred p-type dopant is magnesium in this case. The barrier layer 1 serves as a p-type barrier layer for the active region 2.

The tunnel contact 5 between n-conducting region 6 and p-type barrier layer 1 makes it possible for the current transport in the semiconductor chip 20 to take place to the greatest possible extent in the n-conducting region. This minimizes ohmic losses during operation of the chip. A p-type barrier layer 1 downstream of the tunnel contact 5 is necessary in order to obtain a good crystal quality for the subsequent active region 2 of the semiconductor chip 20.

A diffusion barrier 4 preferably succeeds the p-doped barrier layer 1. The diffusion barrier 4 is preferably suitable for reducing or preventing a contamination of the active region 2 with the p-type dopant—that is to say with magnesium, for example. Without diffusion barrier 4, the contamination takes place by diffusion of p-type dopant for example from the p-doped barrier layer 1 into the active region 2. In the exemplary embodiment of FIG. 1A, the diffusion barrier 4 comprises an $Al_xGa_{1-x}N$ interlayer, for example. The diffusion barrier 4 is preferably between 1 and 20 nm thick. The aluminum concentration is preferably at most 50 percent.

The active region 2 is disposed downstream of the diffusion barrier 4 as seen in the growth direction c. In the exemplary embodiment of FIG. 1A, the active region preferably comprises precisely one single quantum well structure 8 provided for generating radiation (in this respect, also see FIG. 3). The active region 2 is preferably based on the III-V semiconductor material system $In_yGa_{1-y}N$ where $0<y \le 1$. Preferably, the active region 2 is suitable for generating electromagnetic radiation in the ultraviolet, blue, blue-green, yellow or red spectral range. The indium concentration in the active region 2 is preferably between 10 and 60 percent.

An n-doped barrier layer 3 succeeds the active region 2 as seen in the growth direction c. The n-doped barrier layer 3 is for example a silicon-doped gallium nitride layer. The thickness of the n-doped barrier layer 3 is preferably between 100 and 200 nm.

Moreover, the semiconductor chip 20 in accordance with the exemplary embodiment of FIG. 1A can comprise further layers and regions that are not illustrated in FIG. 1A. Thus, the semiconductor chip can have for example contact layers on the underside of the substrate 7 and on the top side of the barrier layer 3. It is furthermore possible for the substrate 7 to be thinned or completely removed. The semiconductor chip 20 can then be fixed by its surface remote from the substrate 7, for example, on a carrier which, with regard to its coefficient of thermal expansion, can be adapted better to the grown layers than the original growth substrate 7.

The semiconductor chip 20 is preferably produced by means of one of the following epitaxy methods: metal organic vapor phase epitaxy, molecular beam epitaxy, hybrid vapor phase epitaxy. Preferably, the semiconductor chip is grown in the Ga-face growth mode in a direction parallel to the crystallographic c axis.

Figure 1B:
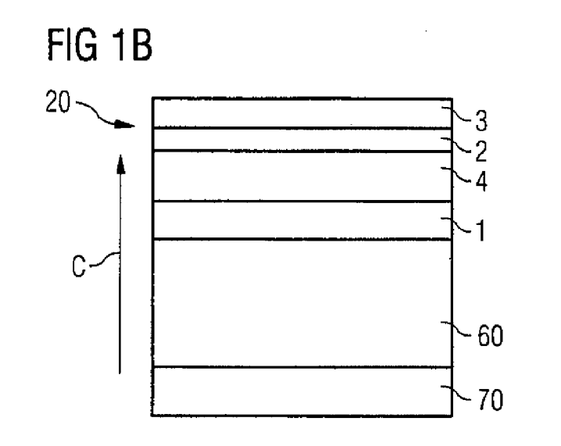
FIG. 1B shows a schematic sectional illustration of a second exemplary embodiment of the optoelectronic semiconductor chip described here.

Furthermore, it is possible for the semiconductor chip 20, as illustrated in FIG. 1B, to have a p-conducting growth substrate 70. In this case, the n-conducting region 6 of the exemplary embodiment of FIG. 1A can be replaced by a p-conducting region 60. The tunnel contact 5 can be omitted. In this case, possible p-conducting substrates are for example: p-GaN, p-SiC, p-Si(111).

Figure 1C:
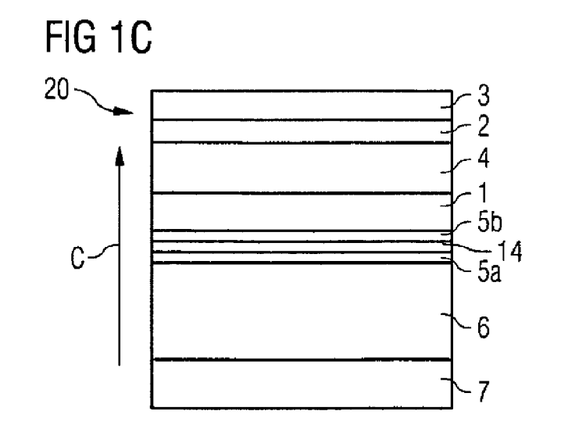
FIG. 1C shows a schematic sectional illustration of a third exemplary embodiment of the optoelectronic semiconductor chip described here.

In a departure from the exemplary embodiment of FIG. 1A, FIG. 1C shows a semiconductor chip 20 in which a diffusion barrier 14 is arranged between the highly n-doped layer 5a of the tunnel contact 5 and the highly p-doped layer 5b of the tunnel contact 5. The diffusion barrier 14 is preferably suitable for inhibiting or preventing a diffusion of the p-type dopant from the highly p-doped layer into the highly n-doped layer. Preferably, the diffusion barrier 14 is an $Al_xGa_{1-x}N$ layer having an aluminum concentration of at least 50 percent, preferably at least 60 percent, particularly preferably at least 80 percent. The layer thickness of the diffusion barrier 14 is preferably between 1 and 2 nm.

Figure 3:
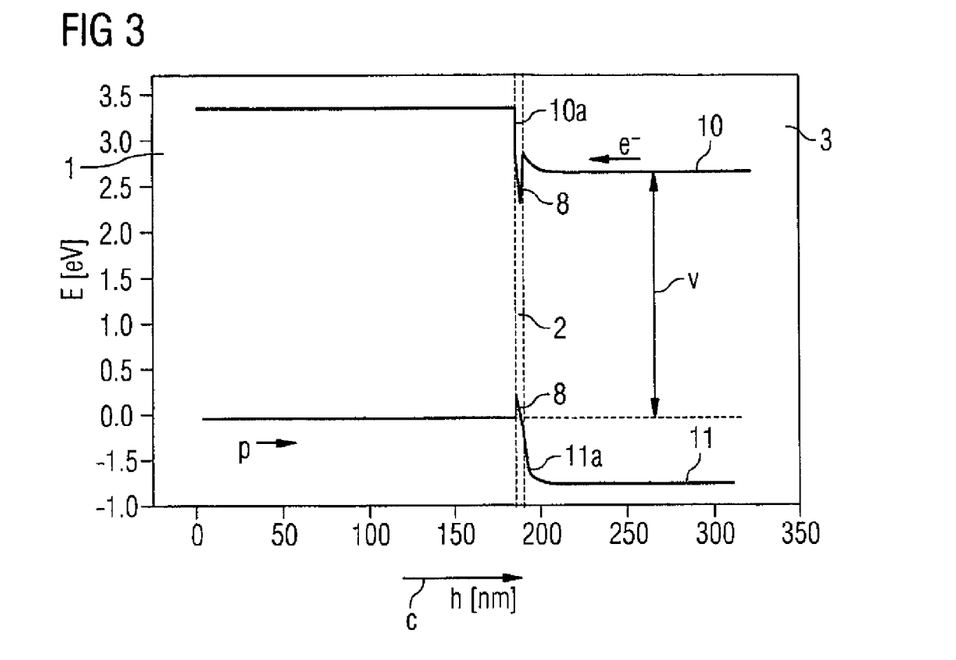
FIG. 3 schematically shows the profile of valence band and conduction band for the first exemplary embodiment of the optoelectronic semiconductor chip described here.

FIG. 3 schematically shows the profile of the conduction band 10 and the profile of the valence band 11 as a function of the growth height h for a semiconductor chip 20 in accordance with the exemplary embodiment of FIG. 1A.

Figure 5:
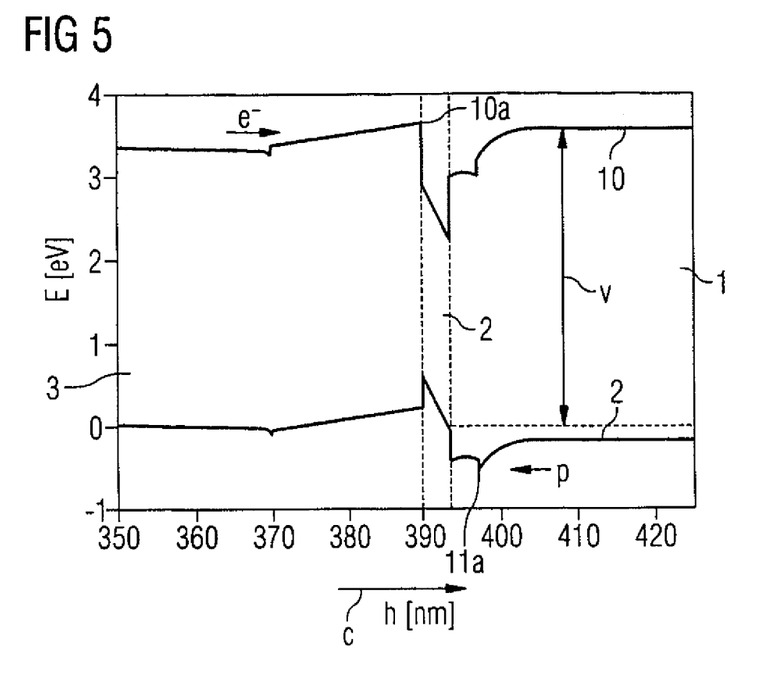
FIG. 5 schematically shows the profile of valence band and conduction band for an optoelectronic semiconductor chip.

FIG. 5 shows, in contrast thereto, the profile of the conduction band 10 and of the valence band 11 as a function of the growth height h for a semiconductor chip in which an n-conducting barrier layer 3, an active region 2 and a p-type barrier layer 1 succeed one another as seen in the growth direction. As can be gathered from FIG. 5, the polarity of the piezoelectric fields described in the general part of the description leads to a barrier 10a for the injection of electrons e which come from the n-doped region 3. The electrons e have to overcome the energy barrier 10a in order to be trapped in the single quantum well 8. A portion of the electrons e which overcome said barrier 10a is not trapped by the quantum well 8, but rather follows the further profile of the conduction band. Therefore, these electrons e are not available for generating radiation. If the operating voltage present at the semiconductor chip is increased, then the proportion of charge carriers which are not trapped by the quantum well 8 increases. As a result, the internal quantum efficiency of the semiconductor chip decreases greatly as the current density increases.

A similar situation holds true for the holes p in the valence band 11. They have to overcome the energy barrier 11a in order to be trapped in the quantum well 8.

The semiconductor chip 20 proposed here is based then on the insight, inter alia, that the piezoelectric fields initially appearing as harmful in the active region 2 of the semiconductor chip 20 can be made usable for improving the charge carrier trapping of a quantum well structure.

As can be seen in this respect in FIG. 3, the change in the layer sequence to p-type barrier layer 1, active region 2 and n-type barrier layer 3 in the growth direction c has the effect that the energy barriers 10a and 11a for electrons e and holes p, respectively, greatly improve the trapping of charge carriers in the quantum well structure 8. Said barriers are disposed downstream of the quantum well structure 8 in the respective flow direction of the charge carriers (indicated by arrows). As a result, the dependence of the quantum efficiency on the current density is greatly reduced or no longer exists at all. The radiation power of such a semiconductor chip is directly proportional to the impressed current over large ranges of the current intensity. In conjunction with a smaller chip area, the improved quantum efficiency permits a higher luminous power without losing any chip efficiency. Furthermore, the described change in the layer sequence leads to a significant reduction of the operating voltage V of the semiconductor chip 20.

As furthermore illustrated in FIG. 3, the advantage described results in particular for single quantum well structures 8. In quantum well structures disposed upstream of the single quantum well structures 8 as seen in the growth direction c, hardly any injection of charge carriers would take place since the barriers 10a, 11a would firstly have to be overcome.

Figure 2A:
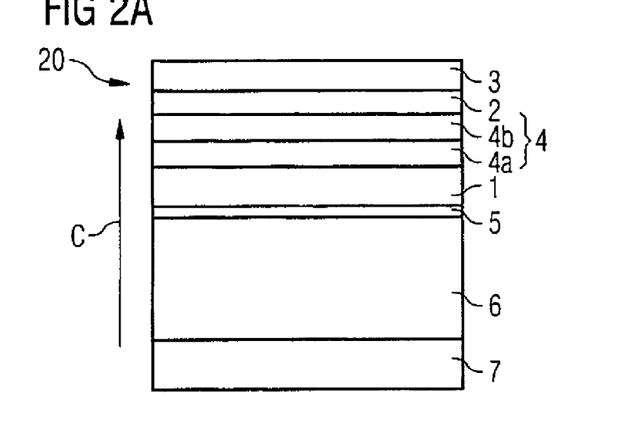
FIG. 2A shows a schematic sectional illustration of a fourth exemplary embodiment of the optoelectronic semiconductor chip described here.

FIG. 2A shows a second exemplary embodiment of the optoelectronic semiconductor chip 20 described here. In a departure from the exemplary embodiment of FIG. 1A, the diffusion barrier 4 is provided by two layers 4a and 4b in this exemplary embodiment. The layer 4a is an $In_yGa_{1-y}N$ layer comprising a quantum well structure 9 that is not provided for generating radiation. The layer 4b may be provided for example by an intrinsic gallium nitride layer.

Figure 4:
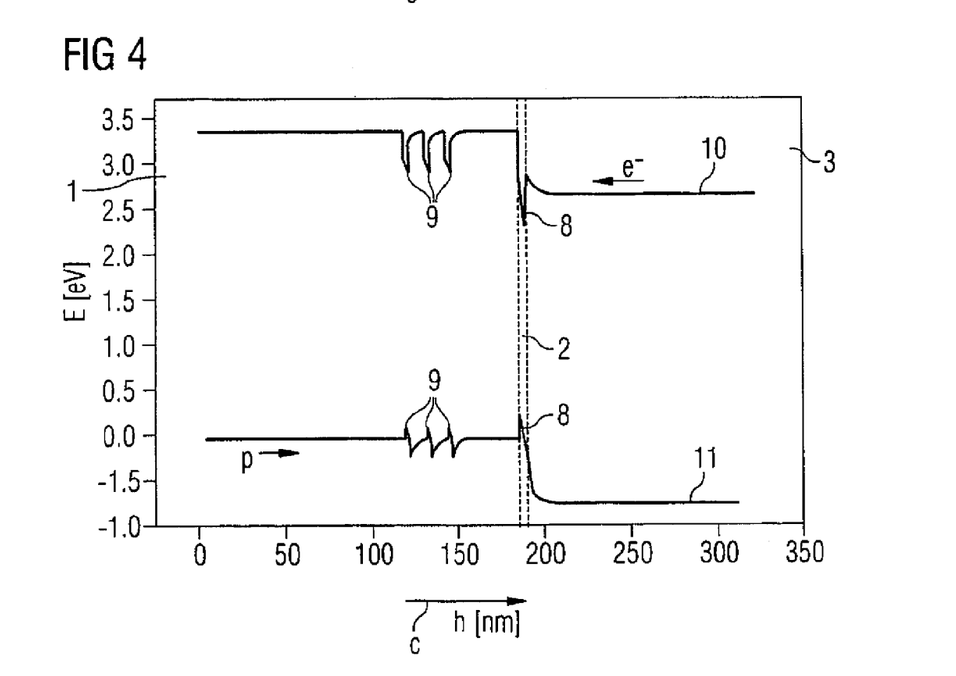
FIG. 4 schematically shows the profile of valence band and conduction band for the fourth exemplary embodiment of the optoelectronic semiconductor chip described here.

FIG. 4 schematically shows the conduction band 10 and the valence band 11 as a function of the growth height h for the semiconductor chip 20 illustrated in FIG. 2A. In this case, three less deep quantum wells 9 are disposed upstream of the single quantum well 8 as seen in the growth direction, said quantum wells 9 not being provided for generating radiation. These quantum well structures 9 are based for example on the III-V semiconductor material system $In_yGa_{1-x-y}Al_xN$ having an indium proportion of at most 10 percent. By contrast, the indium proportion in the optically active quantum well 8 is preferably between 10 and 60 percent.

In this case, the semiconductor chip 20 of FIG. 2A is based on the insight, inter alia, that the optically inactive quantum well structures 9 on the one hand inhibit the diffusion of a p-type dopant such as magnesium, for example. On the other hand, the quantum well structures 9 form a superlattice for the single quantum well structure 8 and thus improve the crystal structure for the active region 2.

Figure 2B:
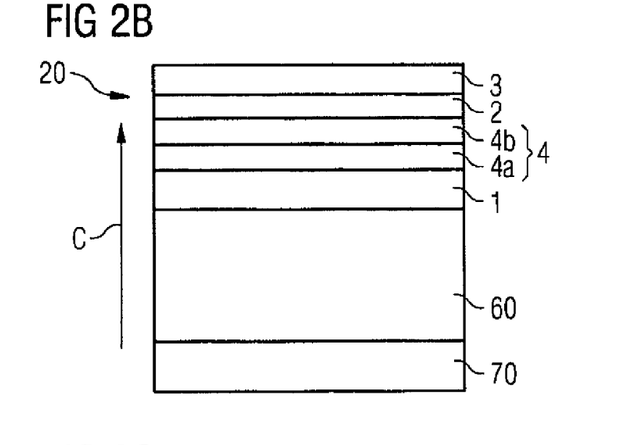
FIG. 2B shows a schematic sectional illustration of a fifth exemplary embodiment of the optoelectronic semiconductor chip described here.

In a departure from the exemplary embodiment of FIG. 2A, FIG. 2B shows an optoelectronic chip 20 in which the layer sequences are deposited onto a p-conducting substrate 70. In this case, the n-conducting region 6 is replaced by a p-conducting region 60, and the tunnel contact 5 can be omitted.

Figure 2C:
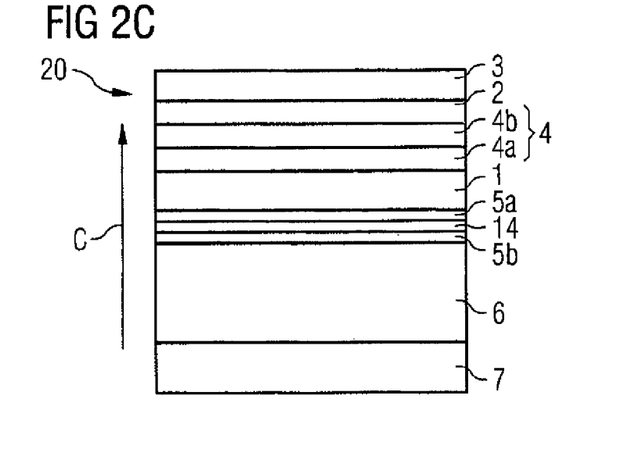
FIG. 2C shows a schematic sectional illustration of a sixth exemplary embodiment of the optoelectronic semiconductor chip described here.

In a departure from the exemplary embodiment of FIG. 2A, FIG. 2C shows a semiconductor chip 20 in which a diffusion barrier 14 is arranged between the highly n-doped layer 5a of the tunnel contact 5 and the highly p-doped layer 5b of the tunnel contact 5. The diffusion barrier 14 is preferably suitable for inhibiting or preventing a diffusion of the p-type dopant from the highly p-doped layer into the highly n-doped layer. Preferably, the diffusion barrier 14 is an $Al_xGa_{1-x}N$ layer having an aluminum concentration of at least 50 percent, preferably at least 60 percent, particularly preferably at least 80 percent. The layer thickness of the diffusion barrier 14 is preferably between 1 and 2 nm.

Figure 6:
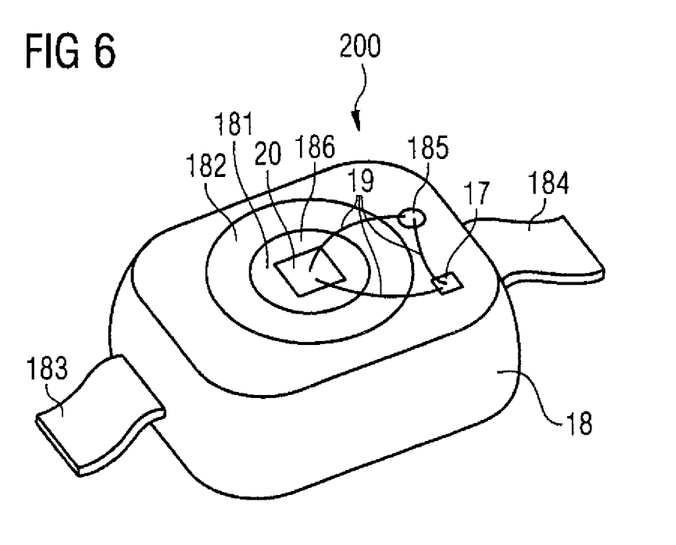
FIG. 6 shows an optoelectronic component comprising one of the optoelectronic semiconductor chips in accordance with the exemplary embodiments of FIGS. 1 and 2.
Figure 7:
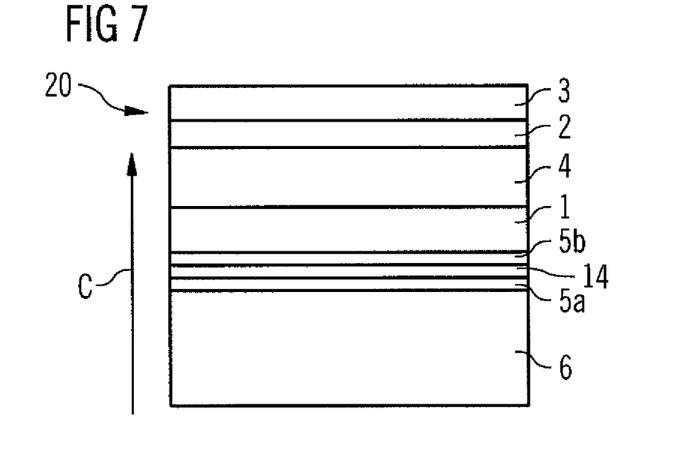
FIG. 7 shows a schematic sectional illustration of one exemplary embodiment of an optoelectronic semiconductor chip.

FIG. 6 shows an optoelectronic component 200. The optoelectronic component 200 is preferably a luminescence diode. The semiconductor chip 20 is consequently a luminescence diode chip. The semiconductor chip 20 is provided by a semiconductor chip described in connection with FIGS. 1 and 2. It is arranged for example into the cutout of a housing 18.

The housing 18 is formed for example from a plastic or a ceramic material. The chip is electrically conductively connected by one of its surfaces to the external connection part 183. By way of example, for this purpose the chip can be bonded onto the connection part 183, which lies free in the cutout of the housing 18. The semiconductor chip 20 is furthermore connected to the external connection part 184. By way of example, the semiconductor chip 20 is electrically conductively connected to the connection part 184 by a wire bonding wire 19. For this purpose, the housing 18 may have a further cutout 185, for example, in which the second connection part 184 is freely accessible.

A reflector 182 is furthermore disposed downstream of the chip 20, which reflector may be formed by a part of the housing. Furthermore, an element 17 for protecting the semiconductor chip 20 against overvoltages, for example against ESD (Electrostatic Discharge) voltage pulses is connected in parallel or antiparallel with the semiconductor chip 20. The element 17 may be for example a light emitting diode, a zener diode or a varistor.

The chip 20 is furthermore preferably surrounded by a potting compound 186, which may contain for example silicone, epoxy resin or PMMA. The potting compound 186 may furthermore contain a luminescence conversion material suitable for converting at least one portion of the electromagnetic radiation wavelengths generated by the luminescence diode chip 20 during operation. White light, inter alia, can be generated in this way. Suitable luminescence conversion materials, such as a YAG:Ce powder, for instance, are described e.g. in U.S. Pat. No. 6,066,861, the content of which relating to the luminescence conversion materials is hereby incorporated by reference.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. An optoelectronic semiconductor chip comprising the following sequence of regions in a growth direction of the optoelectronic semiconductor chip:
    a p-doped barrier layer for an active region;
    said active region, which is suitable for generating electromagnetic radiation, said active region being based on a hexagonal compound semiconductor;
    an n-doped barrier layer for said active region, wherein said active region comprises a quantum well structure for generating at least a part of said electromagnetic radiation, and
    at least one further quantum well structure which is not provided for generating radiation and which is disposed below said quantum well structure provided for generating radiation, as seen in the growth direction, wherein said at least one further quantum well structure which is not provided for generating radiation is exclusively arranged between said p-doped barrier layer and said quantum well structure for generating said at least a part of said electromagnetic radiation, and wherein said at least one further quantum well structure which is not provided for generating radiation is a diffusion barrier for a p-dopant from said p-doped barrier layer.

2. The optoelectronic semiconductor chip of claim 1, wherein said active region is based on a III-V semiconductor material system $In_yGa_{1-x-y}Al_xN$, where $0 \leq x \leq 1$, $0 \leq y \leq 1$ and $x+y \leq 1$ or on the III-V semiconductor material system $In_yGa_{1-y}N$, where $0 < y \leq 1$.

3. The optoelectronic semiconductor chip of claim 1, wherein a further diffusion barrier is arranged between said p-doped barrier layer and said active region, said diffusion barrier being suitable for impeding the diffusion of a dopant into said active region, wherein said further diffusion barrier comprises an $Al_xGa_{1-x}N$ interlayer with an aluminum concentration x of at most 50 percent (%).

4. The optoelectronic semiconductor chip of claim 1, wherein a tunnel contact is disposed below said p-doped barrier layer as seen in the growth direction.

5. The optoelectronic semiconductor chip of claim 4, wherein said tunnel contact has a highly n-doped region, a highly p-doped region and a diffusion barrier between said highly n-doped and highly p-doped regions of said tunnel contact.

6. The optoelectronic semiconductor chip of claim 4, wherein an n-conducting region is disposed below said tunnel contact as seen in the growth direction.

7. The optoelectronic semiconductor chip of claim 1, wherein regions of the optoelectronic semiconductor chip are deposited onto a p-conducting growth substrate.

8. The optoelectronic semiconductor chip of claim 1, wherein said active region comprises precisely one single quantum well structure provided for generating radiation.

9. The optoelectronic semiconductor chip of claim 1, wherein said at least one further quantum well structure which is not provided for generating radiation has a lower indium concentration than said quantum well structure provided for generating radiation.

10. The optoelectronic semiconductor chip of claim 1, wherein a diffusion barrier containing a material from a III-V semiconductor material system $Al_xGa_{1-x}N$, where $x \geq 0.2$, is arranged between said p-doped barrier layer and said active region.

11. The optoelectronic semiconductor chip of claim 1, further comprising a growth substrate having a misorientation, wherein said misorientation of said growth substrate is between 0.1 degree and 1.0 degree.

12. The optoelectronic semiconductor chip of claim 2, which is grown in a Ga-face growth mode.

13. The optoelectronic semiconductor chip of claim 1, which is free of a growth substrate.

14. A method for producing an optoelectronic semiconductor chip according to claim 1 by depositing the sequence of regions onto a wafer in the growth direction.

15. The method of claim 14, wherein said active region, which is suitable for generating electromagnetic radiation, is based on a III-V semiconductor material system $In_yGa_{1-x-y}Al_xN$ where $0 \leq x \leq 1$, $0 \leq y \leq 1$ and $x+y \leq 1$.

16. The method of claim 15, wherein the optoelectronic semiconductor chip is grown in a Ga-face growth mode.

17. The method of claim 14, wherein said diffusion barrier is an $Al_xGa_{1-x}N$ layer with an aluminum concentration x.

18. The method of claim 17, wherein said aluminum concentration x is at least 50%.

19. The method of claim 14, wherein a layer thickness of said diffusion barrier is between 1 nm and 2 nm.

20. An optoelectronic semiconductor chip comprising the following sequence of regions in a growth direction of the optoelectronic semiconductor chip:
    a p-doped barrier layer for an active region;
    said active region, which is suitable for generating electromagnetic radiation, said active region being based on a hexagonal compound semiconductor;
    an n-doped barrier layer for said active region; and
    a tunnel contact below said p-doped barrier layer as seen in the growth direction,
    wherein said active region comprises a quantum well structure for generating at least a part of said electromagnetic radiation,
    wherein said active region is based on a III-V semiconductor material system $In_yGa_{1-x-y}Al_xN$, where $0 \leq x \leq 1$, $0 \leq y \leq 1$ and $x+y \leq 1$ or on the III-V semiconductor material system $In_yGa_{1-y}N$, where $0 < y \leq 1$,
    wherein said tunnel contact has a highly n-doped region with a doping concentration of at least $10^{20}$, a highly p-doped region a doping concentration of at least $10^{20}$ and a diffusion barrier between said highly p-doped region and said highly n-doped region of said tunnel contact, and
    wherein said diffusion barrier is a $Al_xGa_{1-x}N$ layer having an aluminum concentration of at least 60%.

* * * * *